(12) United States Patent
Jo et al.

(10) Patent No.: US 11,800,758 B2
(45) Date of Patent: Oct. 24, 2023

(54) DISPLAY DEVICE HAVING MULTI-SECTION FAN-OUT PORTION

(71) Applicant: Samsung Display Co., Ltd., Yongin-si (KR)

(72) Inventors: Junyoung Jo, Yongin-si (KR); Ilgoo Youn, Yongin-si (KR); Jieun Lee, Yongin-si (KR); Minhee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 144 days.

(21) Appl. No.: 17/160,955

(22) Filed: Jan. 28, 2021

(65) Prior Publication Data

US 2021/0376039 A1  Dec. 2, 2021

(30) Foreign Application Priority Data

Jun. 2, 2020  (KR) ........................ 10-2020-0066705

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(58) Field of Classification Search
CPC ............... H10K 59/131; H10K 77/111; H10K 2102/311; H10K 59/1213; H10K 59/124; Y02E 10/549; G09F 9/301; H01L 27/124; H01L 27/1248
See application file for complete search history.

(56) References Cited

U.S. PATENT DOCUMENTS

| | | | |
|---|---|---|---|
| 9,893,093 B2 | 2/2018 | Kim et al. | |
| 10,243,024 B2 | 3/2019 | Jin et al. | |
| 10,714,563 B2 | 7/2020 | Lee et al. | |
| 2015/0187279 A1* | 7/2015 | Lee | H01L 51/5203 438/23 |
| 2017/0287394 A1* | 10/2017 | Kim | G09G 3/3266 |
| 2017/0288009 A1* | 10/2017 | Kim | H01L 27/3262 |
| 2018/0138207 A1* | 5/2018 | Kim | H10K 59/131 |
| 2018/0301520 A1* | 10/2018 | Jin | H10K 59/88 |
| 2019/0250447 A1* | 8/2019 | Abe | G02F 1/13452 |

FOREIGN PATENT DOCUMENTS

| | | |
|---|---|---|
| KR | 10-2017-0114034 | 10/2017 |
| KR | 10-2017-0115153 | 10/2017 |
| KR | 10-2018-0115395 | 10/2018 |
| KR | 10-2019-0077155 | 7/2019 |

* cited by examiner

*Primary Examiner* — J. E. Schoenholtz
(74) *Attorney, Agent, or Firm* — KILE PARK REED & HOUTTEMAN PLLC

(57) ABSTRACT

A display device includes a fan-out portion including a first fan-out portion including first conductive lines, and a second fan-out portion including second conductive lines. The first conductive lines are apart from each other by a first pitch in a bending area of a substrate of the display device. The second conductive lines are apart from each other by a second pitch in the bending area.

17 Claims, 15 Drawing Sheets

DISPLAY DEVICE HAVING MULTI-SECTION FAN-OUT PORTION

CROSS-REFERENCE TO RELATED APPLICATION(S)

This application claims priority to and benefits of Korean Patent Application No. 10-2020-0066705 under 35 U.S.C. § 119, filed in the Korean Intellectual Property Office on Jun. 2, 2020, the entire contents of which are incorporated herein by reference.

BACKGROUND

1. Technical Field

One or more embodiments relate to a display device with improved visibility.

2. Description of the Related Art

Organic light-emitting display devices among display devices are getting the attention as a next-generation display device because of a wide viewing angle, excellent contrast, and a fast response speed thereof.

Generally, an organic light-emitting display device may include a thin-film transistor and organic light-emitting diodes on a substrate. The organic light-emitting diodes operate by emitting light themselves. Such an organic light-emitting display device may be used in a display part of a small-sized product such as a mobile phone or the like, or may be used in a display part of a large-sized product such as a television or the like.

A display device such as an organic light-emitting display device may have a display part on a substrate and a fan-out part in which lines may extend to one side of the display part. At least a portion of such a display device may be bent to improve the visibility at various angles or reduce the area of a non-display area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device in which a dead area may be significantly reduced and emission uniformity between adjacent pixels may be improved. However, these problems are exemplary, and the scope of the disclosure is not limited thereto.

Additional aspects will be set forth in part in the description which follows and, in part, will be apparent from the description, or may be learned by practice of the presented embodiments of the disclosure.

According to an embodiment, a display device may include a substrate including a display area, a non-display area including a first non-display area adjacent to the display area, and a second non-display area, and a bending area disposed between the first non-display area and the second non-display area. The display device may include a display part disposed in the display area, a driving circuit disposed in the non-display area, and a fan-out portion arranged in the first non-display area, the bending area and the second non-display area. The first non-display area, the bending area, and the second non-display area may be disposed between the display part and the driving circuit. The fan-out portion may deliver to the display part a data signal applied from the driving circuit. The fan-out portion may include a first fan-out portion including first conductive lines, and a second fan-out portion including second conductive lines. The first conductive lines may be apart from each other by a first pitch in the bending area. The second conductive lines may be apart from each other by a second pitch in the bending area.

According to an embodiment, the first fan-out portion and the second fan-out portion may be apart from each other in the bending area.

According to an embodiment, the first conductive lines may include a first line to an n-th line, the second conductive lines may include a first line to an m-th line, and the n-th line of the first conductive lines and the first line of the second conductive lines may be disposed closest to each other among the first to n-th lines of the first conductive lines and the first to m-th lines of the second conductive lines.

According to an embodiment, the first pitch may be less than the second pitch.

According to an embodiment, the fan-out portion may include a third fan-out portion including third conductive lines, and the third conductive lines may be apart from each other by a third pitch in the bending area.

According to an embodiment, the third pitch may be greater than the first pitch.

According to an embodiment, the third pitch may be equal to the first pitch.

According to an embodiment, the third pitch may be less than the second pitch.

According to an embodiment, the third pitch may be equal to the second pitch.

According to an embodiment, in a plan view, the first conductive lines and the second conductive lines may be bent two or more times.

According to an embodiment, the first conductive lines and the second conductive lines may not be bent in the bending area.

According to an embodiment, a portion of the first conductive lines and the second conductive lines disposed in the bending area may be disposed on a different insulating film from a portion of the first conductive lines and the second conductive lines disposed in the first non-display area and the second non-display area, and a portion of the fan-out portion corresponding to the bending area may be disposed on a different insulating film than and a portion of the fan-out portion corresponding to the first non-display area and the second non-display area.

According to an embodiment, the display part may include a thin-film transistor and a light-emitting element electrically connected to the thin-film transistor. The thin-film transistor may include a semiconductor layer, a gate electrode, and a connection electrode electrically connected to the semiconductor layer, the portion of the fan-out portion corresponding to the bending area and the connection electrode may include a same material, and the portion of the fan-out portion corresponding to the first non-display area and the second non-display area and the gate electrode may include a same material.

According to an embodiment, the display device may further include an insulating layer disposed on the substrate, wherein the insulating layer may include an opening corresponding to the bending area.

According to an embodiment, the display device may further include an organic insulating layer disposed in the opening of the insulating layer.

According to an embodiment, a portion of the fan-out portion corresponding to the bending area may be disposed on the organic insulating layer.

According to an embodiment, the first conductive lines and the second conductive lines may include data lines.

According to another aspect of the present disclosure, a display device may include a substrate including a display area, a first non-display area adjacent to the display area, a second non-display area, and a bending area disposed between the first non-display area and the second non-display area. The display device may include a fan-out portion arranged over the first non-display area, the bending area, and the second non-display area, the fan-out portion including conductive lines disposed in the bending area with a separation area between the conductive lines. The conductive lines may be apart from each other by different pitches from each other.

According to an embodiment, the conductive lines disposed in an outer portion of the fan-out portion may be apart from each other by a first pitch, and the conductive lines disposed in a central portion of the fan-out portion may be apart from each other by a second pitch.

According to an embodiment, the first pitch may be less than the second pitch.

Other aspects, features, and advantages other than those described above will now become apparent from the following drawings, claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
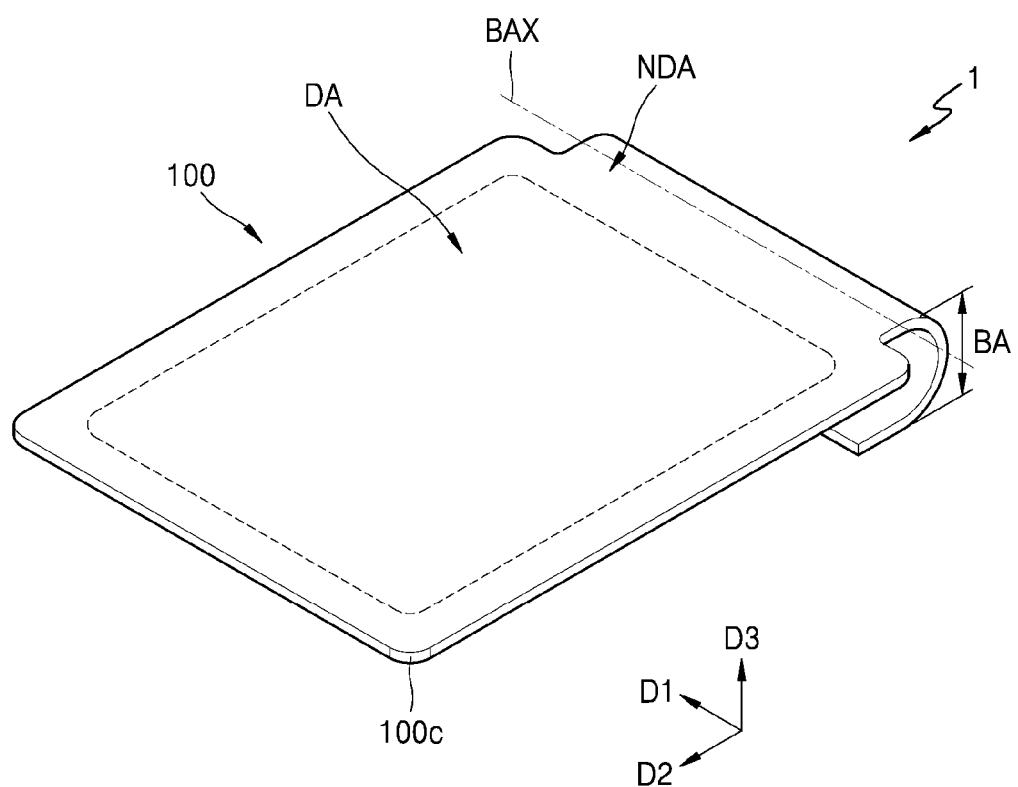
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

It is to be understood that the terms such as "comprising", "including" and "having" are intended to indicate the existence of the features, or elements disclosed in the disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. For example, intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

In the disclosure, "A and/or B" may include "A," "B," or "A and B." In the disclosure, "at least one of A and B" may include "A," "B," or "A and B."

In the following disclosure, it will be understood that when a wire is referred to as "extending in a first direction or a second direction," it may not only extend in a linear shape, but also can extend in the first direction or the second direction in a zigzag or curved line.

In the following disclosure, a "plan view" indicates that a portion of a target object is seen from above, and a "cross-sectional view" indicates that a portion of a target object is vertically cut and the cross-section is viewed from the side. In the following disclosure, the term "overlapping" includes overlapping in a plan view or a cross-sectional view. The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

The disclosure will now be described more fully with reference to the accompanying drawings, in which embodiments of the disclosure are shown like reference numerals in the drawings denote like elements.

Figure 2:
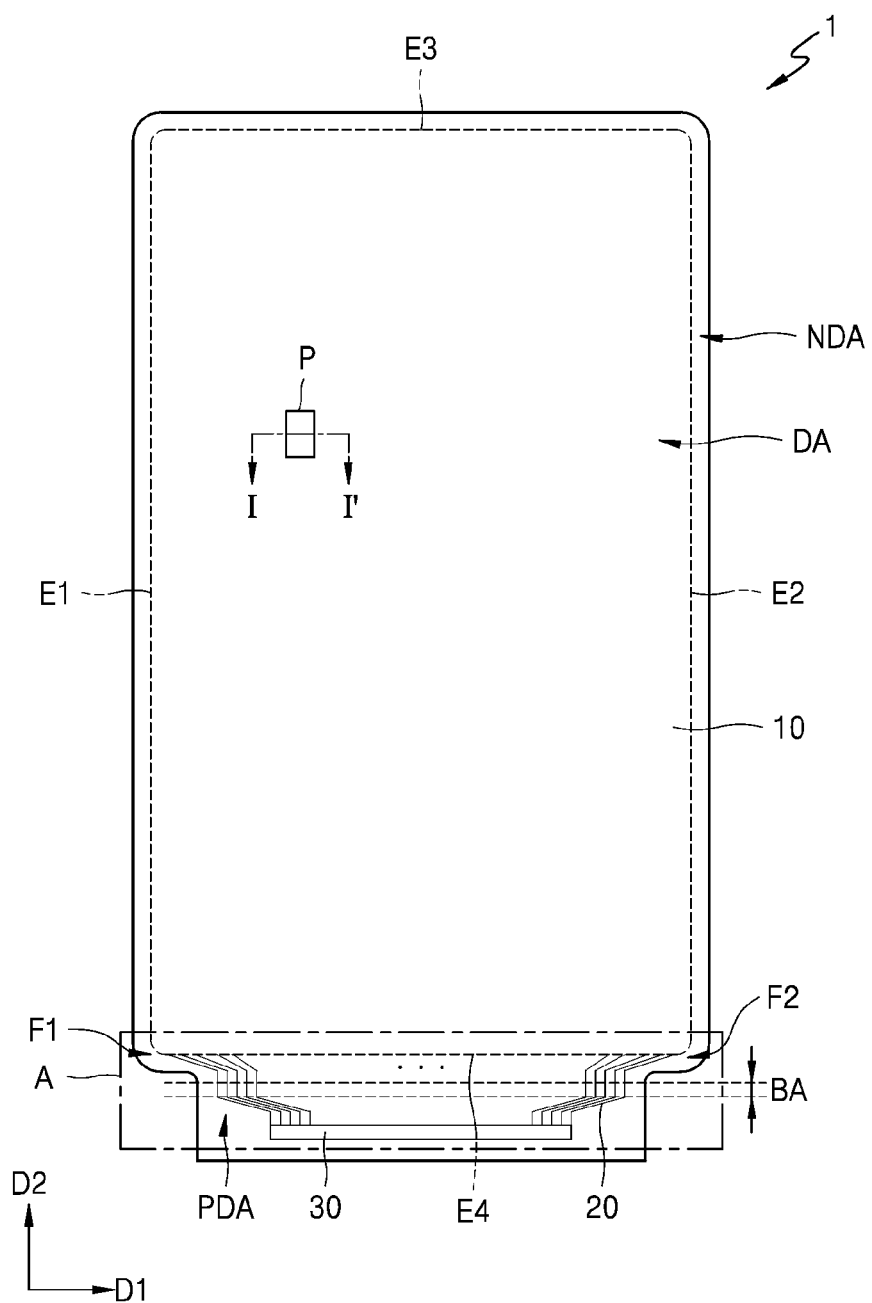
FIG. 2 is a schematic plan view of a display device according to an embodiment.

FIG. 1 is a schematic perspective view of a display device 1 according to an embodiment, and FIG. 2 is a schematic plan view of the display device 1 according to an embodiment.

Referring to FIG. 1, the display device 1 according to an embodiment may include a display area DA, a non-display area NDA around the display area DA, and a bending area BA in which a portion of the non-display area NDA may be bent. A remaining area except for the bending area BA may be an area having a substantially flat surface. As shown in FIG. 1, the bending area BA may be bent with respect to a bending axis BAX extending in a first direction D1.

A substrate 100 may include various flexible, bendable, or rollable materials. For example, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, cellulose acetate propionate, or a combination thereof.

Various modifications may be made. For example, the substrate 100 may have a multi-layer structure including two layers and a barrier layer between the two layers, the two layers including the polymer resin, and the barrier layer including an inorganic material such as silicon oxide, silicon nitride, silicon oxynitride, or the like. According to another embodiment, in a case of a display in which the substrate 100 may not need to be bent, the substrate 100 may include glass.

In the substrate 100, the width of the non-display area NDA including the bending area BA in the first direction D1 may be less than the width, of a portion in which the display area DA is located in the first direction D1. A corner portion 100c of edges of the substrate 100 may have a round shape. The round shape may also be applied in the display area DA, as shown in FIG. 2.

Referring to FIG. 2, the display device 1 may include a display area DA in which pixels P may be located, and a non-display area NDA outside the display area DA. The substrate 100 may be understood as having the display area DA and the non-display area NDA. The non-display area NDA may include a pad area PDA, which may be an area to which various types of electronic devices such as an integrated circuit (IC) or a printed circuit board, or the like may be electrically attached to one side of the display area DA.

FIG. 2 is a plan view illustrating a state of the substrate 100 or the like during a manufacturing operation of the display device 1. In a final display device or an electronic device, such as a smart phone or the like, including a display device, a portion of the substrate 100 or the like may be bent to minimize the area of the non-display area NDA recognized by a user, as shown in FIG. 1. For example, as shown in FIGS. 1 and 2, the substrate 100 may have portions having different widths in the first direction D1, and the substrate 100 may be bent in a portion having a narrow width with respect to the bending axis BAX parallel to the first direction D1.

At least a portion of the pad area PDA may overlap the display area DA. A bending direction may be set such that the pad area PDA does not cover the display area DA and the pad area PDA may be behind the display area DA. Accordingly, a user may recognize that the display area DA occupies most of a display device.

Edges of the display area DA may have a shape similar to a rectangle or a square as a whole. In particular, the display area DA may include a first edge E1 and a second edge E2, which face each other, and a third edge E3 and a fourth edge E4, which may be between the first edge E1 and the second edge E2. The pad area PDA may be adjacent to the fourth edge E4 among the first edge E1 to the fourth edge E4. A first portion F1 connecting the first edge E1 to the fourth edge E4 may have a round shape. The display area DA may also have a round shape in a second portion F2 connecting the second edge E2 to the fourth edge E4. The display area DA may have a round shape in other portions of the edges thereof.

A display part 10 including pixels P may be disposed (e.g., arranged) in the display area DA. A fan-out portion 20 in which conductive lines may be extended and disposed may be disposed in the pad area PDA. A side of the fan-out portion 20 may be electrically connected to the display part 10, and another side of the fan-out portion 20 may be electrically connected to a driving circuit 30. The driving circuit 30 may include various types of electronic devices, such as an integrated circuit (IC).

A scan driving circuit may be further disposed on the left side and/or right side of the display area DA. The scan driving circuit may provide a scan signal to each pixel P through a scan line, and may provide an emission control signal to each pixel P through an emission control line.

Region A of FIG. 2 will be described later herein.

Figure 3:
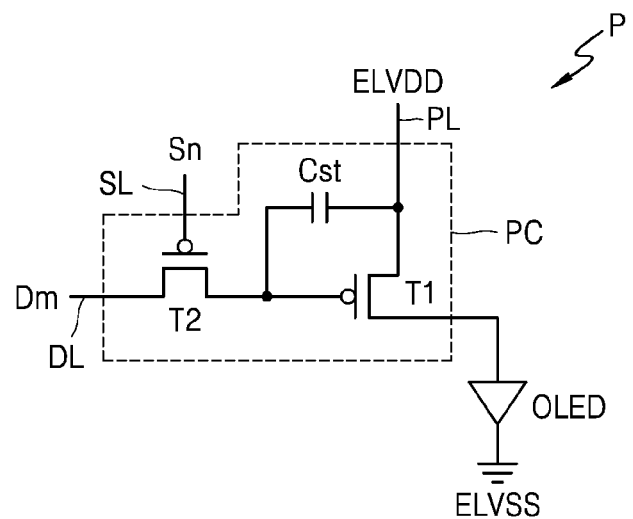
FIGS. 3 and 4 are schematic diagrams of equivalent circuits of a pixel in a display device according to an embodiment.
Figure 4:
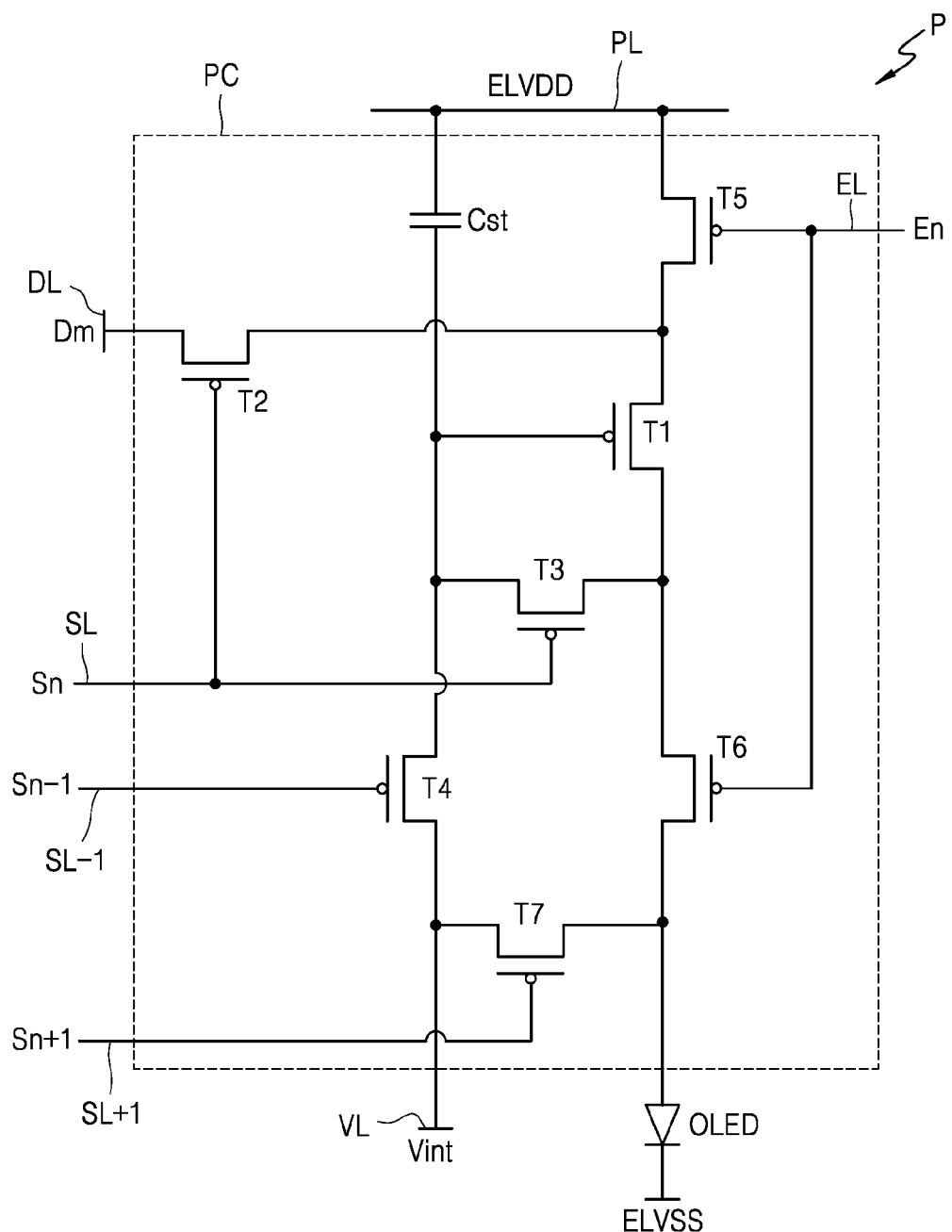

FIGS. 3 and 4 are schematic diagrams of equivalent circuits of the pixel P included in a display device according to an embodiment.

Referring to FIG. 3, a pixel circuit PC may be electrically connected to an organic light-emitting diode OLED to implement light emission of the pixels P. The pixel circuit PC may include a driving thin-film transistor T1, a switching thin-film transistor T2, and a storage capacitor Cst. The switching thin-film transistor T2 may be electrically connected to a scan line SL and a data line DL, and may deliver, to the driving thin-film transistor T1, a data signal Dm input through the data line DL according to a scan signal Sn input through the scan line SL.

The storage capacitor Cst may be electrically connected to the switching thin-film transistor T2 and a driving voltage line PL, and may store a voltage corresponding to a difference between a voltage received from the switching thin-film transistor T2 and a voltage supplied to the driving voltage line PL.

The driving thin-film transistor T1 may be electrically connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light having a certain brightness according to the driving current.

Although FIG. 3 illustrates that the pixel circuit PC includes two thin-film transistors and one storage capacitor, the disclosure is not limited thereto.

Referring to FIG. 4, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, a second initialization thin-film transistor T7, and the storage capacitor Cst.

Although FIG. 4 illustrates that each pixel circuit PC may be provided with signal lines SL, SL−1, SL+1, EL, and DL, an initialization voltage line VL, and the driving voltage line PL, the disclosure is not limited thereto. As another embodiment, at least one of the signal lines SL, SL−1, SL+1, EL, and DL or/and the initialization voltage line VL may be shared by neighboring pixel circuits.

A drain electrode of the driving thin-film transistor T1 may be electrically connected to the organic light-emitting diode OLED via the emission control thin-film transistor T6. The driving thin-film transistor T1 may receive the data signal Dm according to a switching operation of the switching thin-film transistor T2 and supply a driving current to the organic light-emitting diode OLED.

A gate electrode of the switching thin-film transistor T2 may be electrically connected to the scan line SL, and a source electrode of the switching thin-film transistor T2 may be electrically connected to the data line DL. A drain electrode of the switching thin-film transistor T2 may be electrically connected to a source electrode of the driving thin-film transistor T1 and electrically connected to the driving voltage line PL via the operation control thin-film transistor T5.

The switching thin-film transistor T2 may be turned on according to the scan signal Sn received through the scan line SL and may perform a switching operation of transferring the data signal Dm transferred to the data line DL to the source electrode of the driving thin-film transistor T1.

A gate electrode of the compensation thin-film transistor T3 may be electrically connected to the scan line SL. A source electrode of the compensation thin-film transistor T3 may be electrically connected to the drain electrode of the driving thin-film transistor T1 and electrically connected to a pixel electrode of the organic light-emitting diode OLED via the emission control thin-film transistor T6. A drain electrode of the compensation thin-film transistor T3 may be electrically connected to any one electrode of the storage capacitor Cst, a source electrode of the first initialization thin-film transistor T4, and a gate electrode of the driving thin-film transistor T1. The compensation thin-film transistor T3 may be turned on according to the scan signal Sn received through the scan line SL and connect the gate electrode of the driving thin-film transistor T1 to the drain electrode of the driving thin-film transistor T1 to diode-connect the driving thin-film transistor T1.

A gate electrode of the first initialization thin-film transistor T4 may be electrically connected to a previous scan line SL−1. A drain electrode of the first initialization thin-film transistor T4 may be electrically connected to the initialization voltage line VL. A source electrode of the first initialization thin-film transistor T4 may be electrically connected to any one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1, and deliver an initialization voltage Vint to the gate electrode of the driving thin-film transistor T1 to perform an initialization operation of initializing a voltage of the gate electrode of the driving thin-film transistor T1.

A gate electrode of the operation control thin-film transistor T5 may be electrically connected to an emission control line EL. A source electrode of the operation control thin-film transistor T5 may be electrically connected to the driving voltage line PL. A drain electrode of the operation control thin-film transistor T5 may be electrically connected to the source electrode of the driving thin-film transistor T1 and the drain electrode of the switching thin-film transistor T2.

A gate electrode of the emission control thin-film transistor T6 may be electrically connected to the emission control line EL. A source electrode of the emission control thin-film transistor T6 may be electrically connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on according to an emission control signal En received through the emission control line EL, and a driving voltage ELVDD may be transferred to the organic light-emitting diode OLED to allow a driving current to flow through the organic light-emitting diode OLED.

A gate electrode of the second initialization thin-film transistor T7 may be electrically connected to a following scan line SL+1. A source electrode of the second initialization thin-film transistor T7 may be electrically connected to the pixel electrode of the organic light-emitting diode OLED. A drain electrode of the second initialization thin-film transistor T7 may be electrically connected to the initialization voltage line VL. The second initialization thin-film transistor T7 may be turned on according to a following scan signal Sn+1 received through the following scan line SL+1 and initialize the pixel electrode of the organic light-emitting diode OLED.

Although FIG. 4 illustrates that the first initialization thin-film transistor T4 and the second initialization thin-film transistor T7 may be respectively electrically connected to the previous scan line SL−1 and the following scan line SL+1, the disclosure is not limited thereto. As another embodiment, the first initialization thin-film transistor T4 and the second initialization thin-film transistor T7 may be both electrically connected to the previous scan line SL−1 and driven according to the previous scan signal Sn−1.

Another electrode of the storage capacitor Cst may be electrically connected to the driving voltage line PL. Any one electrode of the storage capacitor Cst may be electrically connected to the gate electrode of the driving thin-film transistor T1, the drain electrode of the compensation thin-film transistor T3, and the source electrode of the first initialization thin-film transistor T4.

An opposite electrode (for example, a cathode electrode) of the organic light-emitting diode OLED may receive a common voltage ELVSS. The organic light-emitting diode OLED receives driving current from the driving thin-film transistor T1 to emit light.

The pixel circuit PC is not limited to the number of thin-film transistors and storage capacitors and the circuit designed described with reference to FIG. 4, and the number of thin-film transistors and storage capacitors and the circuit design may be variously changed.

Figure 5:
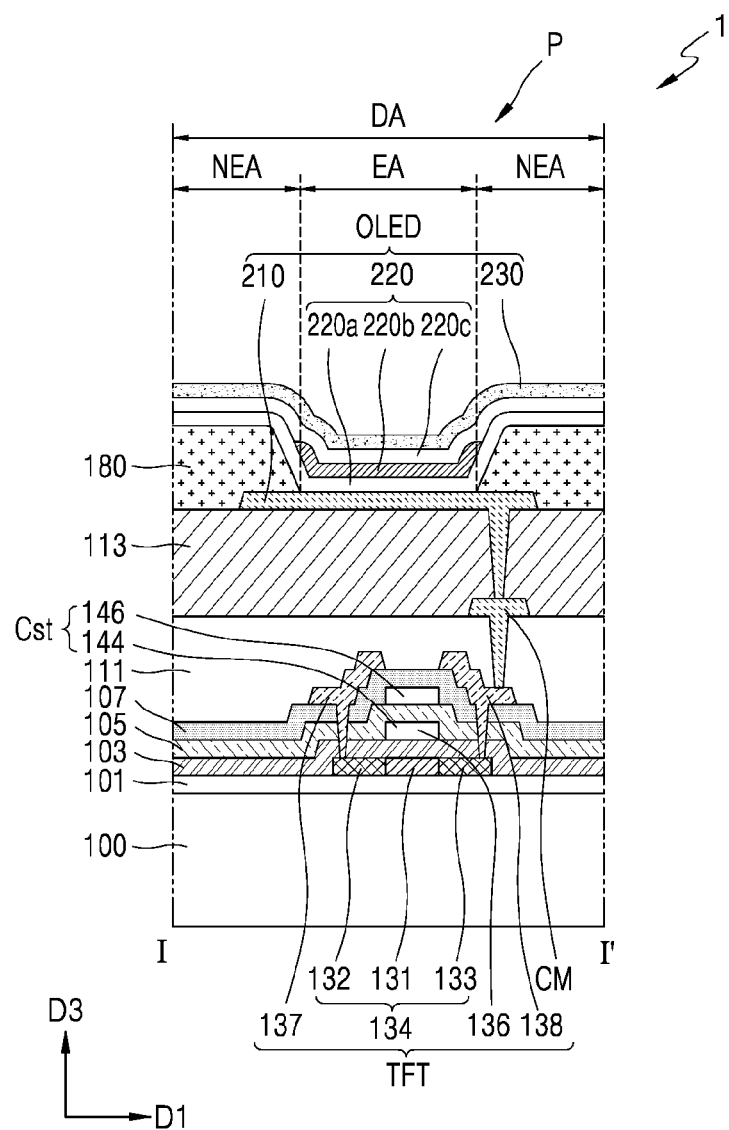
FIG. 5 is a schematic cross-sectional view of a display device according to an embodiment.

FIG. 5 is a schematic cross-sectional view of the display device 1 according to an embodiment. FIG. 5 corresponds to a cross-sectional view of the display device 1 taken along line I-I' of FIG. 2.

Referring to FIG. 5, a thin-film transistor TFT and the organic light-emitting diode OLED may be disposed above the substrate 100.

A buffer layer 101 may be disposed on the substrate 100. The buffer layer 101 may be disposed on the substrate 100 to reduce or block penetration of a foreign substance, moisture, or external air from below the substrate 100 and provide a flat surface on the substrate 100. The buffer layer 101 may include an inorganic material such as oxide or nitride, an organic material, or a composite of an organic material and an inorganic material. The buffer layer 101 may include a single-layer or multi-layer structure including an inorganic material and an organic material.

The thin-film transistor TFT may be disposed on the buffer layer 101. The thin-film transistor TFT may include a semiconductor layer 134, a gate electrode 136 overlapping the semiconductor layer 134, and a connection electrode electrically connected to the semiconductor layer 134. The thin-film transistor TFT may be electrically connected to the organic light-emitting diode OLED and drive the organic light-emitting diode OLED.

The semiconductor layer 134 may be disposed on the buffer layer 101, and may include a channel area 131 overlapping the gate electrode 136, and a source area 132 and drain area 133 respectively disposed on both sides of the channel area 131 and including impurities at a higher concentration than that of the channel area 131. Herein, the impurities may include an N-type impurity or a P-type impurity. The source area 132 and the drain area 133 may be electrically connected to the connection electrode of the thin-film transistor TFT.

The semiconductor layer 134 may include an oxide semiconductor and/or a silicon semiconductor. In case that the semiconductor layer 134 includes an oxide semiconductor, the semiconductor layer 134 may include, for example, an oxide of at least one material selected from a group including indium (In), gallium (Ga), tin (Sn), zicronium (Zr), vanadium (V), hafnium (Hf), cadmium (Cd), germanium (Ge), chromium (Cr), titanium (Ti), and zinc (Zn). For example, the semiconductor layer 134 may include In—Sn—Zn—O (ITZO), In—Ga—Zn—O (IGZO), or the like. In case that the semiconductor layer 134 includes a silicon semiconductor, the semiconductor layer 134 may include, for example, amorphous silicon (a-Si) or low temperature poly silicon (LTPS) in which amorphous silicon (a-Si) may be crystallized.

A first insulating layer 103 may be disposed on the semiconductor layer 134. The first insulating layer 103 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 103 may include a single layer or a multilayer, each including the above-stated inorganic insulating materials.

The gate electrode 136 may be disposed on the first insulating layer 103. The gate electrode 136 may include a single layer or a multilayer including at least one metal from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be electrically connected to a gate line which applies an electrical signal to the gate electrode 136.

A second insulating layer 105 may be disposed on the gate electrode 136. The second insulating layer 105 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 105 may include a single layer or a multilayer, each including the above-stated inorganic insulating materials.

The storage capacitor Cst may be disposed on the first insulating layer 103. The storage capacitor Cst may include a lower electrode 144 and an upper electrode 146 overlapping the lower electrode 144. The lower electrode 144 and the upper electrode 146 of the storage capacitor Cst may overlap each other with the second insulating layer 105 between the lower electrode 144 and the upper electrode 146.

The lower electrode 144 of the storage capacitor Cst may overlap the gate electrode 136 of the thin-film transistor TFT, and the lower electrode 144 of the storage capacitor Cst may be disposed as a single body with the gate electrode 136 of the thin-film transistor TFT. As an embodiment, the storage capacitor Cst may not overlap the thin-film transistor TFT, and the lower electrode 144 of the storage capacitor Cst may be a separate independent component from the gate electrode 136 of the thin-film transistor TFT.

The upper electrode 146 of the storage capacitor Cst may include Al, Pt, Pd, Ag, Mg, Au, Ni, Nd, Ir, Cr, Li, Ca, Mo, Ti, W, and/or Cu, and may include a single layer or a multilayer, each including the above-stated materials.

A third insulating layer 107 may be disposed on the upper electrode 146 of the storage capacitor Cst. The third insulating layer 107 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 107 may include a single layer or a multilayer, each including the above-stated insulating materials.

A source electrode 137 and a drain electrode 138, which may be connection electrodes, may be disposed on the third insulating layer 107. The source electrode 137 and the drain electrode 138 may include a conductive material including Mo, Al, Cu, Ti, or the like, or a combination thereof, and may be a multilayer or a single layer including the above-stated material. The source electrode 137 and the drain electrode 138 may include a multilayer of Ti/Al/Ti.

A first planarization layer 111 may be disposed on the source electrode 137 and the drain electrode 138. The first planarization layer 111 may include a single layer or a multilayer of a film including an organic material or an inorganic material. As an embodiment, the first planarization layer 111 may include benzocyclobutene (BCB), polyimide (PI), hexamethyldisiloxane (HDMSO), a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, or a combination thereof. The first planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like, or a combination thereof. After forming the first planarization layer 111, chemical mechanical polishing may be performed to provide a flat top surface.

A contact metal layer CM may be disposed on the first planarization layer 111. The contact metal layer CM may include Al, Cu, Ti, or the like, or a combination thereof, and may include a single layer or a multilayer. The contact metal layer CM may include a multilayer of Ti/Al/Ti.

A second planarization layer 113 may be disposed on the contact metal layer CM. The second planarization layer 113 may include a single layer or a multilayer of a film including an organic material or an inorganic material. As an embodiment, the second planarization layer 113 may include BCB, PI, HMDSO, a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, or a combination thereof. The second planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like, or a combination thereof. After forming the second planarization layer 113, chemical mechanical polishing may be performed to provide a flat top surface. As an embodiment, the second planarization layer 113 may be omitted.

The organic light-emitting diode OLED including a pixel electrode 210, an intermediate layer 220, and an opposite electrode 230 may be disposed on the second planarization layer 113. The pixel electrode 210 may be electrically connected to the contact metal layer CM through a contact hole penetrating the second planarization layer 113, the contact metal layer CM may be electrically connected to the source electrode 137 and the drain electrode 138, which may be the connection electrodes, of the thin-film transistor TFT, through a contact hole penetrating the first planarization layer 111, and the organic light-emitting diode OLED may be electrically connected to the thin-film transistor TFT.

The pixel electrode 210 may be disposed on the second planarization layer 113. The pixel electrode 210 may be a (semi)transparent electrode or a reflective electrode. The pixel electrode 210 may include a reflective film including Al, Pt, Pd, Ag, Mg, Au, Ni, Nd, Ir, Cr, Li, Ca, Mo, Ti, W, Cu, a compound thereof, or the like, and a transparent or semi-transparent electrode layer formed above the reflective film. The transparent or semi-transparent electrode layer may include at least one selected from a group including indium tin oxide (ITO), indium zinc oxide (IZO), zinc oxide (ZnO), indium oxide ($In_2O_3$) indium gallium oxide (IGO), and aluminum zinc oxide (AZO). The pixel electrode 210 may include a structure in which ITO/Ag/ITO may be stacked on each other.

A pixel defining film 180 may be disposed on the second planarization layer 113, and the pixel defining film 180 may have an opening exposing at least a portion of the pixel electrode 210. An area exposed by the opening of the pixel defining film 180 may be defined as an emission area EA. The vicinity of the emission areas EA may be a non-emission area NEA, and the non-emission area NEA may surround the emission areas EA. In other words, the display area DA may include emission areas EA and the non-emission area NEA surrounding the emission areas EA. The pixel defining film 180 may prevent an arc or the like from being generated at an edge of the pixel electrode 210 by increasing a distance between the pixel electrode 210 and the opposite electrode 230 above the pixel electrode 210. The pixel defining film 180 may be formed of, for example, an organic insulating material such as polyimide, polyamide, an acrylic resin, BCB, HMDSO, and a phenol resin in a spin coating method or the like.

The intermediate layer 220 may be disposed on the pixel electrode 210 at least partially exposed by the pixel defining film 180. The intermediate layer 220 may include an emission layer 220b, and a first functional layer 220a and/or a second functional layer 220c may be selectively disposed below or above the emission layer 220b.

As an embodiment, the intermediate layer 220 may be disposed on the pixel electrode 210 at least partially exposed by the pixel defining film 180. In particular, the emission layer 220b of the intermediate layer 220 may be disposed on the pixel electrode 210 at least partially exposed by the pixel defining film 180.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphorescent material emitting red, green, blue, or white light. The emission layer 220b may include a low-molecular-weight organic material or a polymer organic material.

In case that the emission layer 220b includes a low-molecular-weight organic material, the intermediate layer 220 may have a structure in which an HTL, an EML, an EIL, or the like may be stacked in a single or complex structure, and may include various organic materials including copper phthalocyanine (CuPc), N,N'-Di(naphthalene-1-yl)-N,N'-diphenyl-benzidine (NPB), tris-8-hydroxyquinoline aluminum ($Alq_3$), or the like, or a combination thereof. The layers may be formed by a vacuum deposition method.

In case that the emission layer 220b includes a polymer organic material, the intermediate layer 220 may have a structure including the HTL and the emission layer 220b. The HTL may include poly(3,4-ethylenedioxythiophene) (PEDOT), and the emission layer 220b may include a polymer material such as poly(p-phenylene vinylene) (PPV), polyfluorene, or the like, or a combination thereof. The emission layer 220b may be formed by a screen printing method or an inkjet printing method, a laser-induced thermal imaging (LITI) method, or the like.

The opposite electrode 230 may be disposed on the intermediate layer 220. The opposite electrode 230 may be disposed on the intermediate layer 220 and may be disposed to completely cover the intermediate layer 220. The opposite electrode 230 may be disposed above the display area DA and may be disposed to completely cover the display area DA. In other words, the opposite electrode 230 may be formed, by using an open mask, in a single body with an entire display panel to cover the pixels P disposed in the display area DA.

The opposite electrode 230 may include a conductive material having a low work function. For example, the opposite electrode 230 may include a (semi)transparent layer, the (semi)transparent layer including Ag, Mg, Al, Pt, Pd, Au, Ni, Nd, Ir, Cr, Li, Ca, alloys thereof, or the like. In other embodiments, the opposite electrode 230 may further include a layer such as ITO, IZO, ZnO or $In_2O_3$ above the (semi)transparent layer including the above-stated material.

Figure 6:
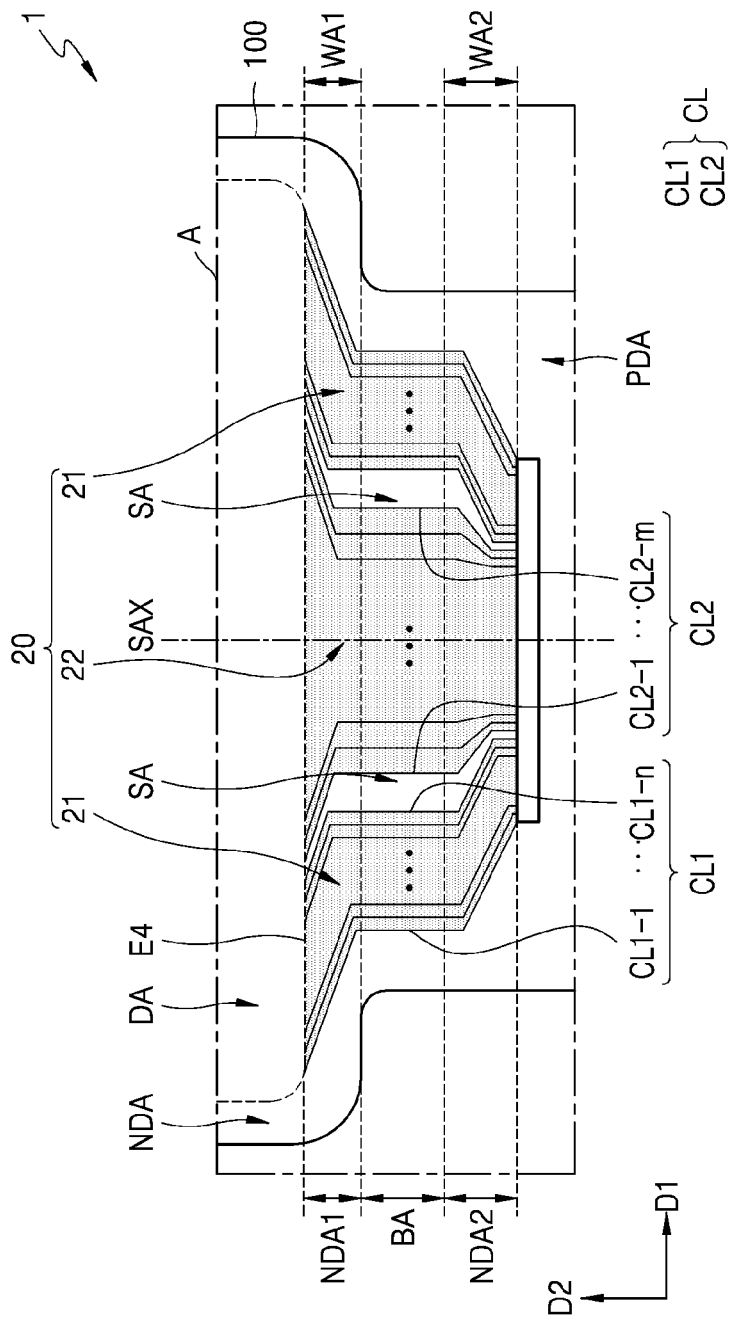
FIG. 6 is a schematic plan view of a display device according to an embodiment.

FIG. 6 is a schematic plan view of the display device 1 according to an embodiment. FIG. 6 is a schematic cross-sectional view of an enlarged region A of FIG.

Referring to FIG. 6, the non-display area NDA may include a first non-display area NDA1, a second non-display area NDA2, and the bending area BA, in addition to the non-display area NDA surrounding the display area DA.

The first non-display area NDA1 and the second non-display area NDA2 may be defined around the bending area BA. The first non-display area NDA1 may be an area adjacent to the fourth edge E4 (of the display area DA?) and may be between the display area DA and the bending area BA. The second non-display area NDA2 may be an area which is not viewed from the front in case that the bending area BA is bent, and may be an area between the bending area BA and the driving circuit 30. The bending area BA may be located between the first non-display area NDA1 and the second non-display area NDA2.

As described above, as the non-display area NDA in contact with the first edge E1 to the third edge E3 of the display area DA shown in FIG. 2, the first non-display area NDA1 may be the non-display area NDA recognized by a user in a final display device or an electronic device, such as a smart phone or the like, including a display device. Because the fan-out portion 20 may be disposed in the first non-display area NDA1, the width of the first non-display area NDA1 may not be easy to be reduced compared to another non-display area NDA (for example, the non-display area NDA in contact with the first edge E1 to third edge E3 of the display area DA).

In the display device 1 according to an embodiment, a width WA1 of the first non-display area NDA1 may be reduced by dividing and designing the fan-out portion 20 into "multiple sections." The "multiple sections" may be understood as respectively corresponding to first fan-out portions 21 and a second fan-out portion 22 of the fan-out portion 20. Accordingly, in the embodiment, the width WA1 of the first non-display area NDA1 may be less than a width WA2 of the second non-display area NDA2.

As shown in FIG. 6, the fan-out portion 20 may include the first fan-out portions 21 and the second fan-out portion 22 which may be disposed in the bending area BA and spaced apart from each other with a separation area SA between the first fan-out portions 21 and the second fan-out portion 22.

The fan-out portion 20 may include conductive lines CL, and the conductive lines CL may be, for example, a data line DL that transfers a data signal applied from the driving circuit 30 to the display part 10.

The conductive lines CL may be disposed to sequentially pass through the first non-display area NDA1, the bending area BA, and the second non-display area NDA2. As shown in FIG. 6, in a plan view, the conductive lines CL may be bent at least twice. Portions where the conductive lines CL are bent may be disposed in the first non-display area NDA1 and the second non-display area NDA2. Because stress concentrates in the bending area BA, the portions where the conductive lines CL may be bent may be formed by avoiding the bending area BA, which has a high risk of disconnection of the conductive lines CL.

The conductive lines CL may extend in a diagonal direction intersecting with the first direction D1 and a second direction D2 in the first non-display area NDA1 and the second non-display area NDA2, and may extend in a direction substantially parallel to the second direction D2 in the bending area BA. A portion of the conductive lines CL in the bending area BA may partially extend to the first non-display area NDA1 and the second non-display area NDA2.

As an embodiment, as shown in FIG. 6, the first fan-out portions 21 may be located on both sides of the second fan-out portion 22 with the second fan-out portion 22 between the first fan-out portions 21. Generally, the fan-out portion 20 may be provided in a symmetrical shape, and the first fan-out portions 21 may be symmetrically disposed with the second fan-out portion 22 between the first fan-out portions 21. The second fan-out portion 22 may be provided in a symmetrical shape around an axis of symmetry SAX, and the first fan-out portions 21 may be respectively disposed on a side and another side of the second fan-out portion 22 with the second fan-out portion 22 between the first fan-out portions 21. For example, the first fan-out portions 21 may be disposed outside the second fan-out portion 22. In the disclosure, the first fan-out portions 21 and the second fan-out portion 22 may be divided by the separation area SA.

The first fan-out portions 21 may include first conductive lines CL1. The first conductive lines CL1 may include n first-first conductive line CL1-1 to first-n conductive line CL1-$n$. The second fan-out portion 22 may include second conductive lines CL2. The second conductive lines CL2 may include m second-first conductive line CL2-1 to second-m conductive line CL2-$m$. The number of first conductive lines CL1 may be the same as or different from the number of second conductive lines CL2.

The first conductive lines CL1 of the first fan-out portions 21 may be formed to have different lengths. The length of each of the first conductive lines CL1 may gradually decrease in the order of the first-first conductive line CL1-1 to the first-n conductive line CL1-$n$. The length of each of the first conductive lines CL1 may be proportional to the resistance thereof. The magnitude of the resistance thereof may decrease in the order of the first-first conductive line CL1-1 to the first-n conductive line CL1-$n$, while the length of each of the first conductive lines CL1 decreases in the order of the first-first conductive line CL1-1 to the first-n conductive line CL1-$n$.

The difference in resistance between conductive lines may cause a difference in resistive-capacitive (RC) delay between pixels respectively electrically connected to the conductive lines. As the magnitude of the resistance of conductive lines gradually decreases in the order of the first-first conductive line CL1-1 to the first-n conductive line CL1-$n$, the difference in the RC delay between the pixels may not be recognized by a user.

Figure 7:
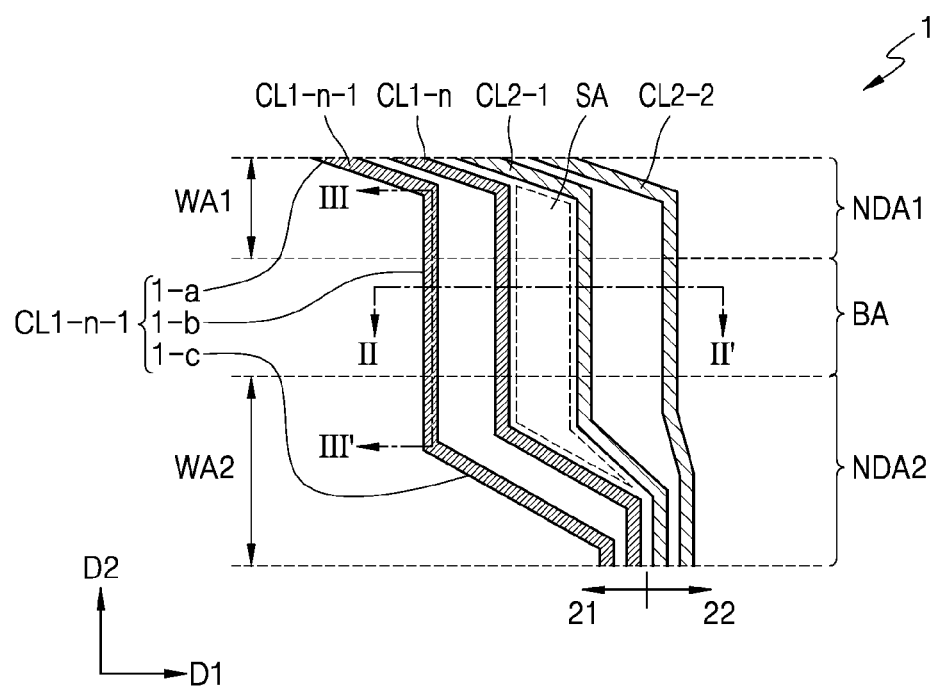
FIG. 7 is a schematic plan view of a display device according to an embodiment.
Figure 8:
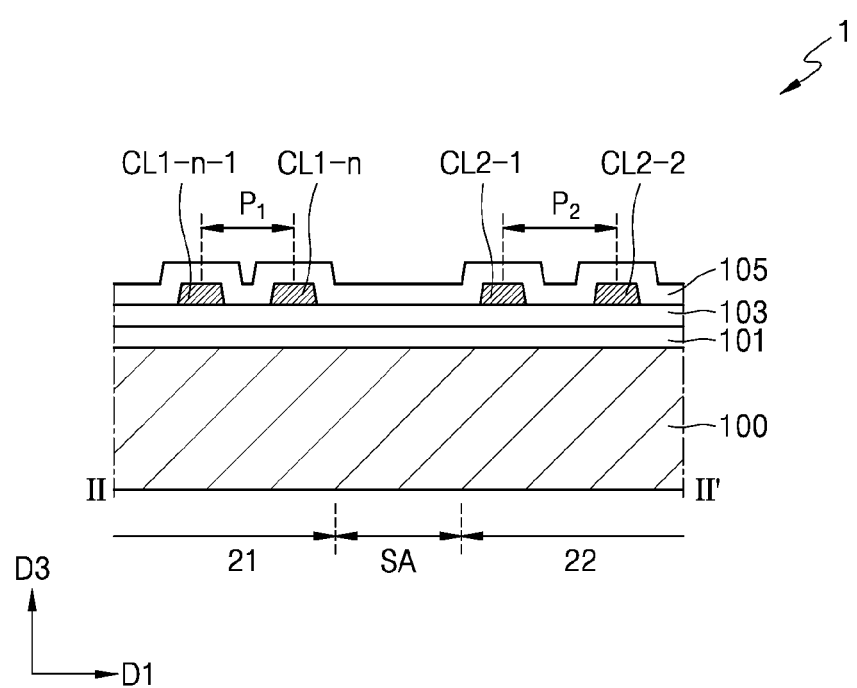
FIG. 8 is a schematic cross-sectional view of a display device according to an embodiment.

FIG. 7 is a schematic plan view of the display device 1 according to an embodiment, and FIG. 8 is a schematic cross-sectional view of the display device 1 according to an embodiment.

In FIGS. 7 and 8, a first-n-first conductive line CL1-$n$-1, a first-n conductive line CL1-$n$, a second-first conductive line CL2-1, and a second-second conductive line CL2-2, which may be disposed adjacent to each other, are illustrated, remaining conductive lines, which may be respectively disposed to continue the first-n-first conductive line CL1-$n$-1 and the second-second conductive line CL2-2, are omitted for convenience of explanation.

The separation area SA may be formed between the first-n conductive line CL1-$n$ and the second-first conductive line CL2-1, which may be disposed adjacent to each other. The separation area SA may generally overlap the bending area BA, and at least a portion of the separation area SA may extend toward the first non-display area NDA1 and the second non-display area NDA2.

Referring to FIGS. 7 and 8, as an embodiment, the buffer layer 101, the first insulating layer 103, and the second insulating layer 105 may be disposed on the substrate 100. The third insulating layer 107 (see FIG. 5) and/or additional layers may be further disposed on the second insulating layer 105. However, descriptions thereof are omitted for convenience of explanation.

As an embodiment, the first-n-first conductive line CL1-n-1, the first-n conductive line CL1-n, the second-first conductive line CL2-1, and the second-second conductive line CL2-2 may be located between the first insulating layer 103 and the second insulating layer 105. As another embodiment, various modifications may be made, for example, the first-n-first conductive line CL1-n-1, the first-n conductive line CL1-n, the second-first conductive line CL2-1, and the second-second conductive line CL2-2 may be located between the buffer layer 101 and the first insulating layer 103, and the first-n-first conductive line CL1-n-1, the first-n conductive line CL1-n, the second-first conductive line CL2-1, and the second-second conductive line CL2-2 may be located between the second insulating layer 105 and the third insulating layer 107. For example, the first-n-first conductive line CL1-n-1 and the first-n conductive line CL1-n may be alternately disposed on different layers, and the second-first conductive line CL2-1 and the second-second conductive line CL2-2 may also be alternately disposed on different layers.

The first-n-first conductive line CL1-n-1 and the first-n conductive line CL1-n disposed in the first fan-out portion 21 may be disposed to be apart from each other by a first pitch $P_1$. Although FIGS. 7 and 8 illustrate that the first-n-first conductive line CL1-n-1 and the first-n conductive line CL1-n disposed in the first fan-out portion 21 may be disposed to be apart from each other by the first pitch $P_1$, the first conductive lines CL1 disposed in the first fan-out portion 21 may also be disposed to be apart from each other by the first pitch $P_1$. In other words, the first conductive lines CL1, which may be the most adjacent to each other, among the first conductive lines CL1 may be disposed to be apart from each other by the first pitch $P_1$. Pitch may be defined as an interval between central axes of two adjacent lines among the first conductive lines CL1. For example, according to the disclosure, the concept of pitch may be understood as the interval between central axes, but not simply the interval or distance between two adjacent lines. In case that the width of each of the first conductive lines CL1 disposed in the bending area BA may be constant, as the first conductive lines CL1 may be spaced apart from each other by the first pitch $P_1$, the interval or distance between the first conductive lines CL1 may also be constant.

The second-first conductive line CL2-1 and the second-second conductive line CL2-2 disposed in the second fan-out portion 22 may be disposed to be apart from each other by a second pitch $P_2$. Although FIGS. 7 and 8 illustrate that the second-first conductive line CL2-1 and the second-second conductive line CL2-2 disposed in the second fan-out portion 22 may be disposed to be apart from each other by the second pitch $P_2$, the second conductive lines CL2 disposed in the second fan-out portion 22 may also be disposed to be apart from each other by the second pitch $P_2$. In other words, the second conductive lines CL2, which may be the most adjacent to each other, among the second conductive lines CL2 may be disposed to be apart from each other by the second pitch $P_2$.

As an embodiment, the first conductive lines CL1 disposed in the first fan-out portion 21 may be disposed to be apart from each other by the first pitch $P_1$, and the second conductive lines CL2 disposed in the second fan-out portion 22 may be disposed to be apart from each other by the second pitch $P_2$. The first pitch $P_1$ in which the first conductive lines CL1 may be apart from each other may be less than the second pitch $P_2$ in which the second conductive lines CL2 may be apart from each other. For example, the pitch between conductive lines disposed in the periphery of a fan-out portion may be less than the pitch disposed in the center of the fan-out portion.

Figure 9:
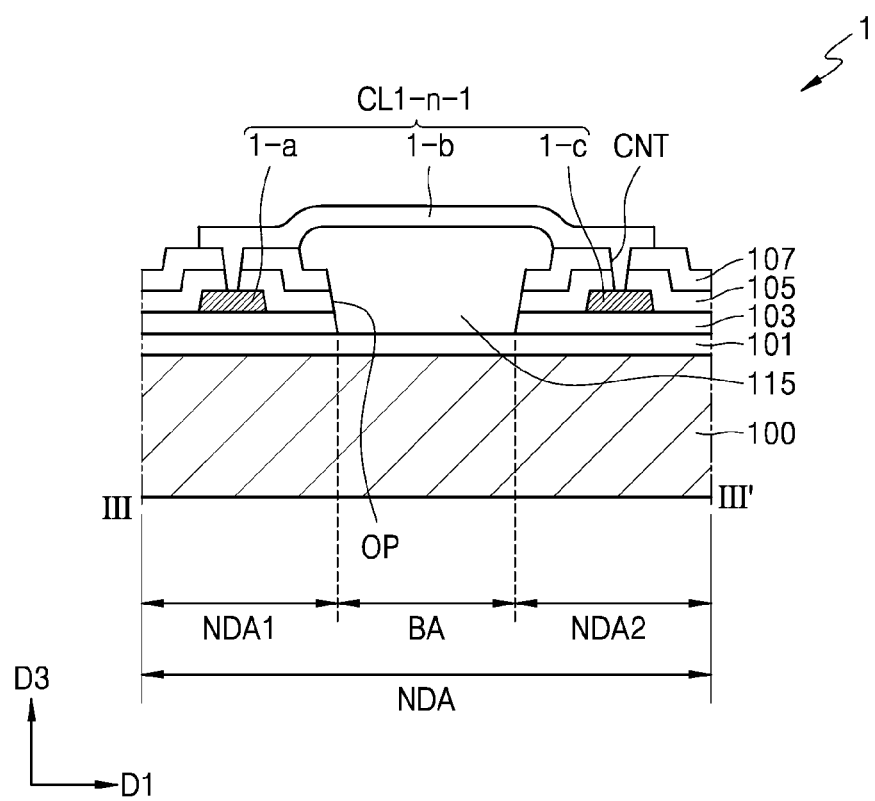
FIG. 9 is a schematic cross-sectional view of a display device according to an embodiment.

FIG. 9 is a schematic cross-sectional view of a display device 1 according to an embodiment. In particular, FIG. 9 corresponds to a cross-sectional view of the display device 1 taken along line III-III' of FIG. 7.

Referring to FIG. 9, the buffer layer 101, the first insulating layer 103, the second insulating layer 105, the third insulating layer 107, and an organic insulating layer 115 may be disposed on the substrate 100 of the non-display area NDA.

An opening OP exposing at least a portion of the buffer layer 101 may be located in the first insulating layer 103, the second insulating layer 105, and the third insulating layer 107 of the non-display area NDA. Although FIG. 9 illustrates that the opening OP may be defined in the first insulating layer 103, the second insulating layer 105, and the third insulating layer 107, as another embodiment, the opening OP may be defined in the buffer layer 101, the first insulating layer 103, the second insulating layer 105, and the third insulating layer 107, and various modifications may be made, for example, the opening OP may be defined in the buffer layer 101, the first insulating layer 103, and the second insulating layer 105.

The organic insulating layer 115 may be disposed inside the opening OP.

Because an inorganic film may be more susceptible to stress than an organic film, a portion of inorganic films disposed in the bending area BA (for example, the first insulating layer 103, the second insulating layer 105, and the third insulating layer 107) may be removed and the organic insulating layer 115 including an organic material may be filled in the opening OP to relieve the stress in the bending area BA.

Referring to FIGS. 7 and 9, the first-n-first conductive line CL1-n-1 may include a first conductive layer 1-a disposed in the first non-display area NDA1, a second conductive layer 1-c disposed in the second non-display area NDA2, and a connection conductive layer 1-b disposed in the bending area BA. Although FIGS. 7 and 9 illustrate that the first-n-first conductive line CL1-n-1 includes the first conductive layer 1-a disposed in the first non-display area NDA1, the second conductive layer 1-c disposed in the second non-display area NDA2, and the connection conductive layer 1-b disposed in the bending area BA, it may be understood that the first conductive line CL1 includes the first conductive layer 1-a disposed in the first non-display area NDA1, the second conductive layer 1-c disposed in the second non-display area NDA2, and the connection conductive layer 1-b disposed in the bending area BA.

As an embodiment, the first conductive layer 1-a and the second conductive layer 1-c may be disposed on the same layer, and the connection conductive layer 1-b may be disposed on a different layer from the first conductive layer 1-a and the second conductive layer 1-c. For example, as shown in FIG. 9, the first conductive layer 1-a and the second conductive layer 1-c may be disposed on the first insulating layer 103, and the connection conductive layer 1-b may be disposed over the organic insulating layer 115 and the third insulating layer 107.

The first conductive layer 1-a and the second conductive layer 1-c and the gate electrode 136 (see FIG. 5) of the thin-film transistor TFT (see FIG. 5) may include a same material. The connection conductive layer 1-b and the source electrode 137 (see FIG. 5) and the drain electrode 138 (see FIG. 5) may include a same material.

The second insulating layer 105 and the third insulating layer 107 may be between the first conductive layer 1-*a* and the second conductive layer 1-*c* and the connection conductive layer 1-*b*. The first conductive layer 1-*a* and the connection conductive layer 1-*b*, and the second conductive layer 1-*c* and the connection conductive layer 1-*b* may be electrically connected to each other through a contact hole CNT defined in the second conductive layer 1-*c* and the third insulating layer 107.

As another embodiment, the first conductive layer 1-*a* and the second conductive layer 1-*c* may be disposed on the second insulating layer 105, and the first conductive layer 1-*a* and the second conductive layer 1-*c* may be disposed on the third insulating layer 107. For example, in case that the first conductive layer 1-*a* and the second conductive layer 1-*c* are disposed on the third insulating layer 107, the first conductive layer 1-*a* and the second conductive layer 1-*c* may be disposed on the same layer as the connection conductive layer 1-*b*.

As an embodiment, at least a portion of the organic insulating layer 115 disposed in the bending area BA may be disposed to extend toward the first non-display area NDA1 and/or the second non-display area NDA2. At least a portion of the first insulating layer 103, the second insulating layer 105, and the third insulating layer 107 disposed in the first non-display area NDA1 and/or the second non-display area NDA2 may be disposed to extend toward the bending area BA.

Figure 10:
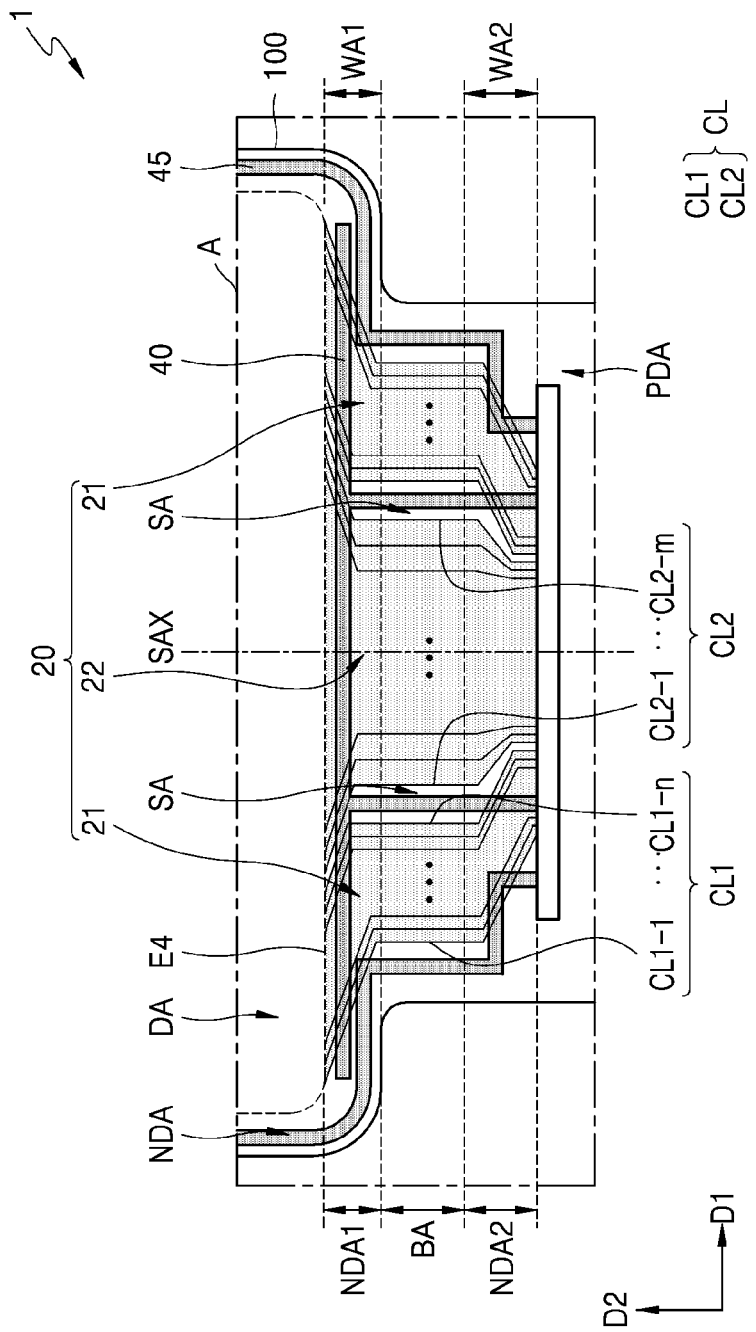
FIG. 10 is a schematic plan view of a display device according to an embodiment.

FIG. 10 is a schematic plan view of the display device 1 according to an embodiment.

Referring to FIG. 10, a driving power supply line 40 and a common power supply line 45 may be disposed in the pad area PDA. At least a portion of the driving power supply line 40 and the common power supply line 45 may be disposed to overlap the fan-out portion 20.

At least a portion of the driving power supply line 40 may be disposed in the separation area SA. In other words, at least a portion of the driving power supply line 40 may be disposed in the separation area SA, for example, between the first fan-out portion 21 and the second fan-out portion 22.

At least a portion of the common power supply line 45 may be disposed in the pad area PDA outside the fan-out portion 20. Although not illustrated in FIG. 10, the common power supply line 45 may have a loop shape with one side open and partially surround the display area DA.

The driving power supply line 40 may include, for example, the same material as that of the source electrode 137 and the drain electrode 138 of the thin-film transistor TFT in FIG. 5. The driving power supply line 40 and the common power supply line 45 of FIG. 10 may overlap the fan-out portion 20 in the first non-display area NDA1 and the second non-display area NDA2, and may not overlap the first non-display area NDA1 in the bending area BA.

Figure 11:
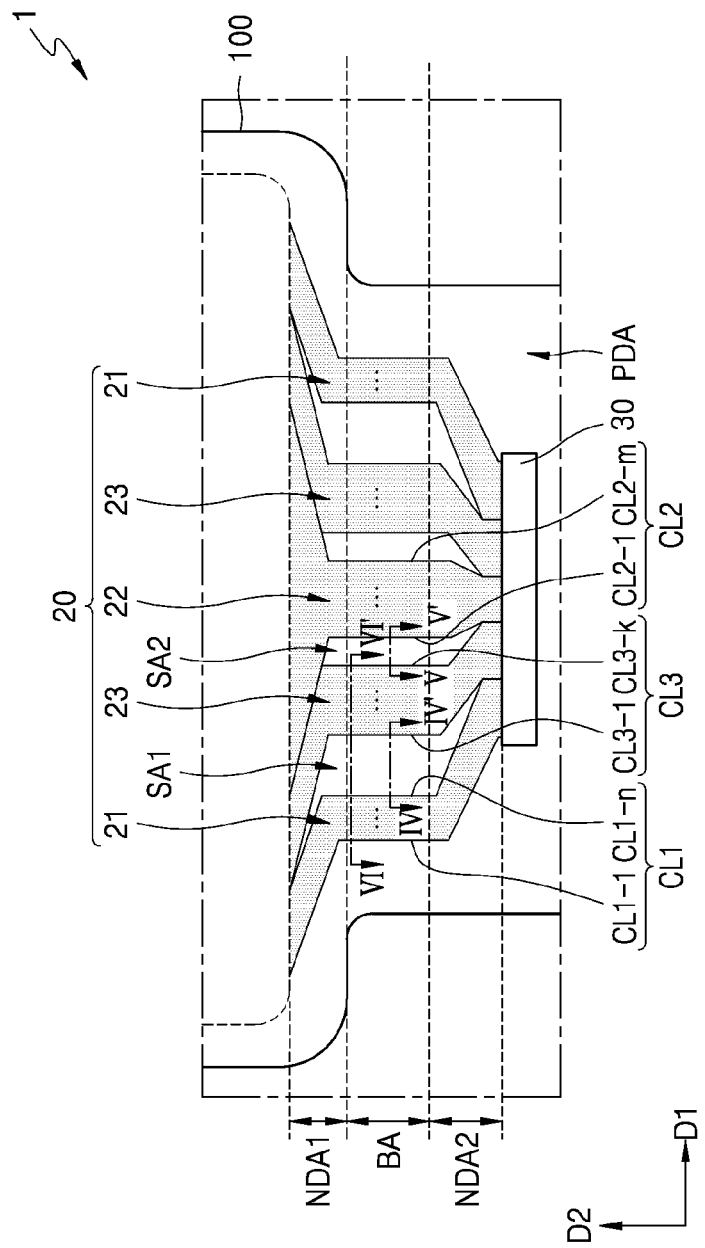
FIG. 11 is a schematic plan view of a display device according to an embodiment.

FIG. 11 is a schematic plan view of the display device 1 according to an embodiment. The embodiment of FIG. 11 differs from the embodiment of FIG. 6 in that the fan-out portion 20 further includes a third fan-out portion 23. Hereinafter, description will be made focusing on the difference. Other structures may be the same or similar to the above-described embodiments.

Referring to FIG. 11, the display device 1 according to an embodiment may include the fan-out portion 20 disposed over the first non-display area NDA1, the bending area BA, and the second non-display area NDA2. The fan-out portion 20 may include the first fan-out portions 21 each disposed in an outer portion of the fan-out portion 20, the second fan-out portion 22, which may be apart from the first fan-out portion 21 in the first direction D1, and the third fan-out portions 23 each disposed between the first fan-out portion 21 and the second fan-out portion 22.

The second fan-out portion 22 may be located in a central portion of the fan-out portion 20, and the first fan-out portions 21 and the third fan-out portions 23 may be located on both sides of the second fan-out portion 22 with the second fan-out portion 22 between the first fan-out portions 21 and the third fan-out portions 23. The first fan-out portions 21 to the third fan-out portions 23 may be symmetrically disposed. The third fan-out portions 23 may be respectively disposed on a side and another side of the second fan-out portion 22 with a second separation area SA2 between the third fan-out portion 23 and the second fan-out portion 22. The first fan-out portions 21 may be respectively disposed outside the third fan-out portions 23 with a first separation area SA1 between the first fan-out portion 21 and the third fan-out portion 23. In the disclosure, the first fan-out portions 21 to the third fan-out portions 23 may be understood as being geometrically divided by the separation area SA.

The first fan-out portions 21 to the third fan-out portions 23 may deliver, to the display part 10, a data signal applied from the driving circuits 30 located in the second non-display area NDA2.

The first fan-out portions 21 may include the first conductive lines CL1. The first conductive lines CL1 may include n first-first conductive line CL1-1 to first-n conductive line CL1-*n*. The second fan-out portion 22 may include the second conductive lines CL2. The second conductive lines CL2 may include m second-first conductive line CL2-1 to second-m conductive line CL2-*m*. The third fan-out portion 23 may include third conductive lines CL3. The third conductive lines CL3 may include k third-first conductive line CL3-1 to third-k line CL3-*k*.

Figure 12:
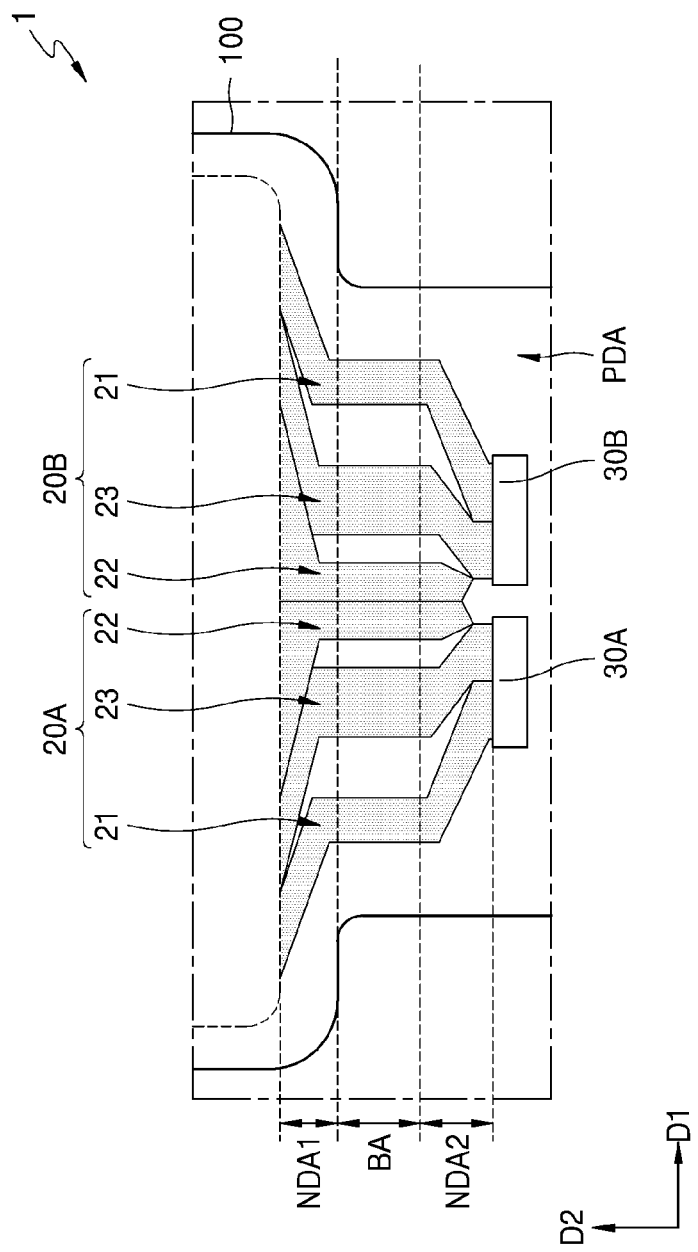
FIG. 12 is a schematic plan view of a display device according to an embodiment.

FIG. 12 is a schematic plan view of the display device 1 according to an embodiment. The embodiment of FIG. 12 differs from the embodiment of FIG. 11 in that a first fan-out portion and a second fan-out portion may be included. Hereinafter, description will be made focusing on the difference. Other structures may be the same or similar to the above-described embodiments.

Referring to FIG. 12, the display device 1 according to an embodiment may include a first fan-out portion 20A and a second fan-out portion 20B which may be disposed over the first non-display area NDA1, the bending area BA, and the second non-display area NDA2. In the embodiment, the first fan-out portion 20A and the second fan-out portion 20B may be respectively electrically connected to a first driving circuit 30A and a second driving circuit 30B. The first fan-out portion 20A and the second fan-out portion 20B may respectively include the first fan-out portion 21 to the third fan-out portion 23.

Figure 13:
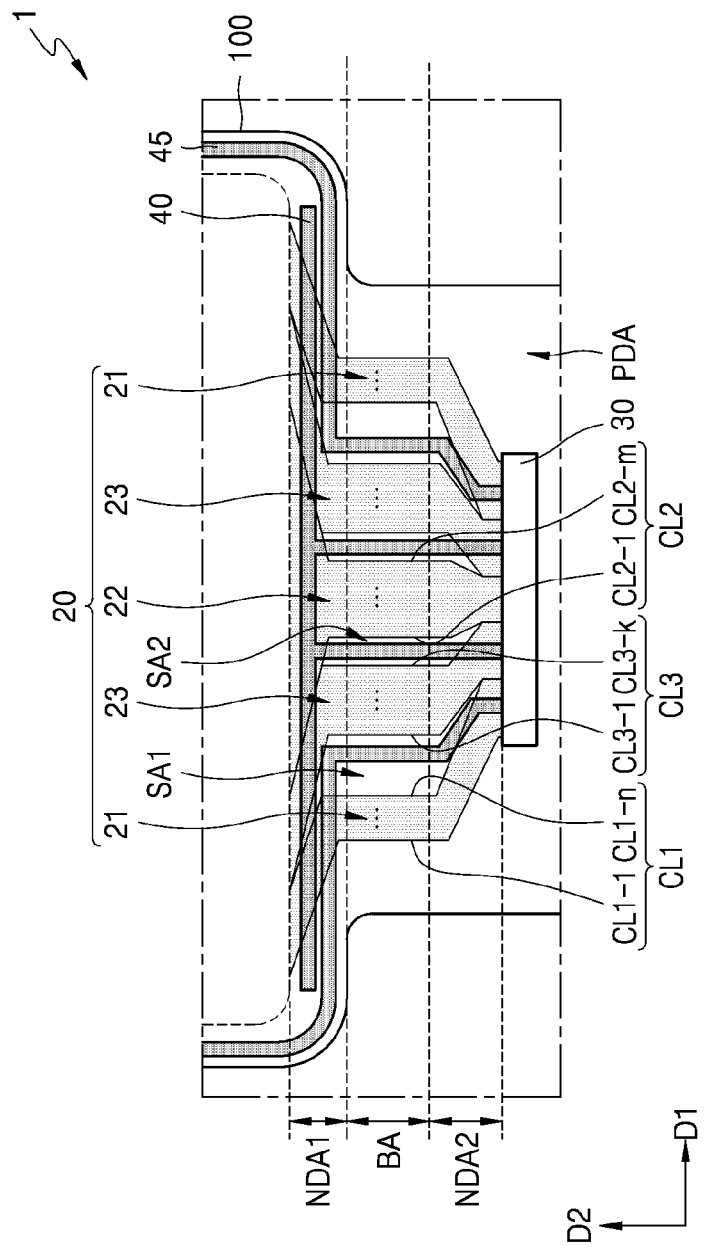
FIG. 13 is a schematic plan view of a display device according to an embodiment.

FIG. 13 is a schematic cross-sectional view of the display device 1 according to an embodiment.

Referring to FIG. 13, the driving power supply line 40 and the common power supply line 45 may be disposed in the pad area PDA. At least a portion of the driving power supply line 40 and the common power supply line 45 may be disposed to overlap the fan-out portion 20. The driving power supply line 40 and the common power supply line 45 may overlap the fan-out portion 20 in the first non-display area NDA1 and the second non-display area NDA2, and may not overlap the fan-out portion 20 in the bending area BA.

At least a portion of the driving power supply line 40 may be disposed in a separation area (the second separation area SA2). In other words, at least a portion of the driving power supply line 40 may be disposed between the second fan-out portion 22 and the third fan-out portions 23.

At least a portion of the common power supply line 45 may be disposed in a separation area (the first separation area SA1). In other words, at least a portion of the driving power supply line 40 may be disposed between the first fan-out portions 21 and the third fan-out portions 23. Although not illustrated in FIG. 13, the common power supply line 45 may have a loop shape with one side open and partially surround the display area DA.

Fifth conductive lines may be further disposed in the pad area PDA outside the fan-out portion 20. At least a portion of the fifth conductive lines may be disposed to overlap the fan-out portion 20. However, the fifth conductive lines may not overlap the fan-out portion 20 in the bending area BA. The fifth conductive lines may deliver, to the display part 10, a scan signal and/or an emission signal applied from the driving circuit 30.

Sixth conductive lines may be further disposed in the separation area (the first separation area SA1). The sixth conductive lines disposed in the separation area (the first separation area SA1) may not overlap the common power supply line 45 in the bending area BA. At least a portion of the sixth conductive lines may be disposed to overlap the fan-out portion 20. The sixth conductive lines may overlap the fan-out portion 20 in the first non-display area NDA1 and the second non-display area NDA2, and may not overlap the fan-out portion 20 in the bending area BA. A side of the sixth conductive lines may be electrically connected to sensing electrodes disposed in the display part 10, and another side of the sixth conductive lines may be electrically connected to the driving circuit 30. As another embodiment, in case that a touch driving circuit separately included, another side of the sixth conductive lines may be electrically connected to the touch driving circuit.

Figure 14:
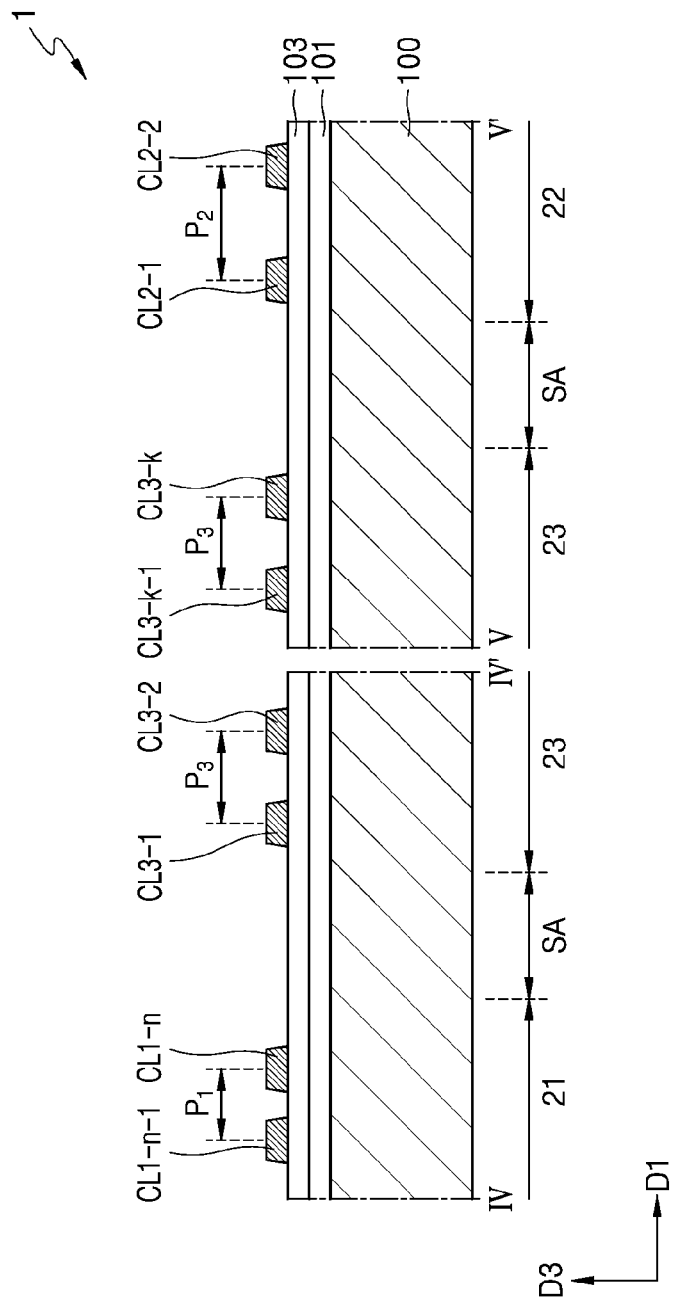
FIG. 14 is a schematic cross-sectional view of a display device according to an embodiment.

FIG. 14 is a schematic cross-sectional view of the display device 1 according to an embodiment. In particular, FIG. 14 corresponds to a cross-sectional view of the display device 1 taken along lines IV-IV' and V-V of FIG. 11.

Referring to FIG. 14, the first-n-first conductive line CL1-*n*-1 and the first-n conductive line CL1-*n* disposed in the first fan-out portion 21 may be disposed to be apart from each other by a first pitch $P_1$. For convenience of explanation, FIG. 13 illustrates that the first-n-first conductive line CL1-*n*-1 and the first-n conductive line CL1-*n* disposed in the first fan-out portion 21 may be disposed to be apart from each other by the first pitch $P_1$, but the first conductive lines CL1 disposed in the first fan-out portion 21 may also be disposed to be apart from each other by the first pitch $P_1$. In other words, the first conductive lines CL1, which may be the most adjacent to each other, among the first conductive lines CL1 may be disposed to be apart from each other by the first pitch $P_1$.

The second-first conductive line CL2-1 and the second-second conductive line CL2-2 disposed in the second fan-out portion 22 may be disposed to be apart from each other by a second pitch $P_2$. For convenience of explanation, FIG. 13 illustrates that the second-first conductive line CL2-1 and the second-second conductive line CL2-2 disposed in the second fan-out portion 22 may be disposed to be apart from each other by the second pitch $P_2$, but the second conductive lines CL2 disposed in the second fan-out portion 22 may also be disposed to be apart from each other by the second pitch $P_2$. In other words, the second conductive lines CL2, which may be the most adjacent to each other, among the second conductive lines CL2 may be disposed to be apart from each other by the second pitch $P_2$.

The third-first conductive line CL3-1 and a third-second conductive line CL3-2, and a third-k-first conductive line CL3-*k*-1 and the third-k conductive line CL3-*k* which may be disposed in the third fan-out portion 23 may be respectively disposed to be apart from each other by a third pitch $P_3$. For convenience of explanation, FIG. 14 illustrates that the third-first conductive line CL3-1 and the third-second conductive line CL3-2, and the third-k-first conductive line CL3-*k*-1 and the third-k conductive line CL3-*k* which may be disposed in the third fan-out portion 23 may be disposed to be apart from each other by the third pitch $P_3$, but the third conductive lines CL3 disposed in the third fan-out portion 23 may be disposed to be apart from each other by the third pitch $P_3$. In other words, the third conductive lines CL3, which may be the most adjacent to each other, among the third conductive lines CL3 may be disposed to be apart from each other by the third pitch $P_3$.

The first conductive lines CL1 disposed in the first fan-out portion 21 may be disposed to be apart from each other by the first pitch $P_1$, and the second conductive lines CL2 disposed in the second fan-out portion 22 may be disposed to be apart from each other by the second pitch $P_2$. The first pitch $P_1$ in which the first conductive lines CL1 may be apart from each other may be less than the second pitch $P_2$ in which the second conductive lines CL2 may be apart from each other.

As an embodiment, the third pitch $P_3$ in which the third conductive lines CL3 may be apart from each other may be greater than the first pitch $P_1$ in which the first conductive lines CL1 may be apart from each other, and may be less than the second pitch $P_2$ in which the second conductive lines CL2 may be apart from each other. ($P_1 < P_3 < P_2$)

As another embodiment, the third pitch $P_3$ in which the third conductive lines CL3 may be apart from each other may be equal to the first pitch $P_1$ in which the first conductive lines CL1 may be apart from each other, and may be less than the second pitch $P_2$ in which the second conductive lines CL2 may be apart from each other. ($P_1 = P_3 < P_2$)

As another embodiment, the third pitch $P_3$ in which the third conductive lines CL3 may be apart from each other may be less than the first pitch $P_1$ in which the first conductive lines CL1 may be apart from each other, and may be equal to the second pitch $P_2$ in which the second conductive lines CL2 may be apart from each other. ($P_1 < P_3 = P_2$)

Figure 15:
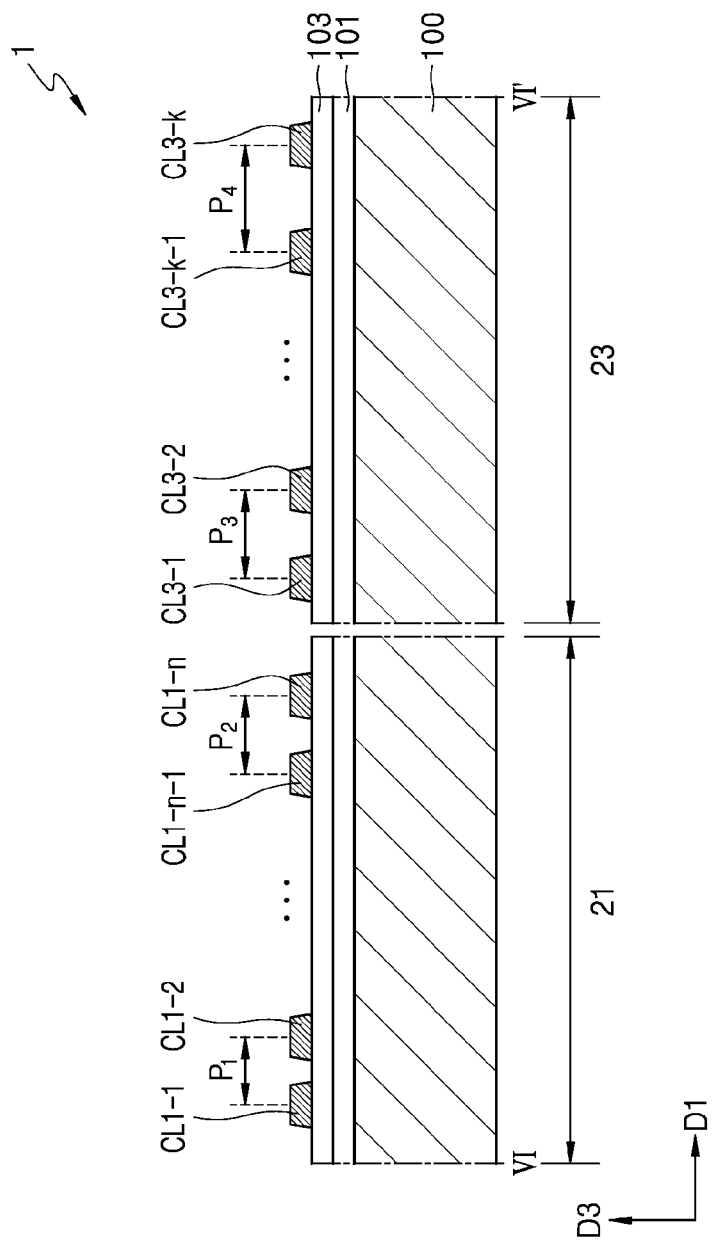
FIG. 15 is a schematic cross-sectional view of a display device according to an embodiment.

FIG. 15 is a schematic cross-sectional view of the display device 1 according to an embodiment. FIG. 15 corresponds to a cross-sectional view of the display device 1 taken along line VI-VI' of FIG. 11.

Referring to FIGS. 11 and 15, the fan-out portion 20 of the display device 1 according to an embodiment may include the first fan-out portion 21, the second fan-out portion 22, and the third fan-out portion 23. The first fan-out portion 21 may include the first conductive lines CL1, the second fan-out portion 22 may include the second conductive lines CL2, and the third fan-out portion 23 may include the third conductive lines CL3.

As an embodiment, the first conductive lines CL1 disposed in the first fan-out portion 21 may have different pitches from each other. The first-first conductive line CL1-1 and a first-second conductive line CL1-2 of the first fan-out portion 21 disposed at an outermost side of the fan-out portion 20 may be disposed to be apart from each other by the first pitch $P_1$, and the first-n-first conductive line CL1-*n*-1 and the first-n conductive line CL1-*n* of the first fan-out portion 21 may be disposed to be apart from each other by the second pitch $P_2$, which may be different from the first pitch $P_1$. The first pitch $P_1$ may be less than the second pitch $P_2$. For example, pitches between the conductive lines disposed in the first fan-out portion 21 may increase from a portion of the outermost side of the fan-out portion 20 to a portion adjacent to the third fan-out portion 23. As an embodiment, each pitch between the conductive lines disposed in the first fan-out portion 21 may gradually increase from a portion of the outermost side of the fan-out portion 20 to a portion adjacent to the third fan-out portion 23. As another embodiment, a pitch may be increased at a certain group interval by grouping the conductive lines disposed in the first fan-out portion 21 into a preset group.

The third conductive lines CL3 disposed in the third fan-out portion 23 may have different pitches from each other. The third-first conductive line CL3-1 and the third-second conductive line CL3-2 of the third fan-out portion 23 adjacent to the first fan-out portion 21 may be disposed to be apart from each other by the third pitch $P_3$, and the third-k-first conductive line CL3-$k$-1 and the third-k conductive line CL3-$k$ of the third fan-out portion 23 adjacent to the second fan-out portion 22 may be disposed to be apart from each other by a fourth pitch $P_4$ which may be different from the third pitch $P_3$. The third pitch $P_3$ may be less than the fourth pitch $P_4$. For example, pitches between the conductive lines disposed in the third fan-out portion 23 may increase from a portion adjacent to the first fan-out portion 21 to a portion adjacent to the second fan-out portion 22. As another embodiment, each pitch between the conductive lines disposed in the third fan-out portion 23 may gradually increase from a portion adjacent to the first fan-out portion 21 to a portion adjacent to the second fan-out portion 22. As another embodiment, a pitch may be increased at a certain group interval by grouping the conductive lines disposed in the third fan-out portion 23 into a preset group.

Although not illustrated in FIG. 15, the second conductive lines CL2 disposed in the second fan-out portion 22 may have different pitches from each other.

According to an embodiment, a pitch (a first pitch) between conductive lines disposed in the first fan-out portion 21 of an outer portion of the fan-out portion 20 may be designed to be less than a pitch (a second pitch) between conductive lines disposed in the second fan-out portion 22 of a central portion of the fan-out portion 20, such that the resistance of the conductive lines disposed in the first fan-out portion 21 may be reduced, and the resistance deviation between the conductive lines disposed in the first fan-out portion 21 and the conductive lines disposed in the second fan-out portion 22 may be reduced.

According to an embodiment, the resistance deviation between adjacent conductive lines with a separation area between the adjacent conductive lines may be reduced, thereby preventing or significantly reducing luminance deviation between adjacent pixels.

According to an embodiment of the disclosure made as described above, a display device having a reduced non-display area and improved emission uniformity between adjacent pixels may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
    a substrate including:
        a display area;
        a non-display area including a first non-display area adjacent to the display area, and a second non-display area; and
        a bending area disposed between the first non-display area and the second non-display area;
    a display part disposed in the display area;
    a driving circuit disposed in the non-display area; and
    a fan-out portion arranged in the first non-display area, the bending area and the second non-display area, wherein
    the first non-display area, the bending area, and the second non-display area are disposed between the display part and the driving circuit,
    the fan-out portion delivers to the display part a data signal applied from the driving circuit,
    the fan-out portion comprises:
        a first fan-out portion comprising first conductive lines;
        a second fan-out portion comprising second conductive lines; and
        a third fan-out portion comprising third conductive lines,
    the first conductive lines are apart from each other by a first pitch in the bending area,
    the second conductive lines are apart from each other by a second pitch in the bending area,
    the third conductive lines are apart from each other by a third pitch in the bending area,
    the third pitch is greater than the first pitch, and
    the third pitch is less than or equal to the second pitch.

2. The display device of claim 1, wherein the first fan-out portion and the second fan-out portion are apart from each other in the bending area.

3. The display device of claim 2, wherein
    the first conductive lines comprise a first line to an n-th line,
    the second conductive lines comprise a first line to an m-th line, and
    the n-th line of the first conductive lines and the first line of the second conductive lines are disposed closest to each other among the first to n-th lines of the first conductive lines and the first to m-th lines of the second conductive lines.

4. The display device of claim 3, wherein the first pitch is less than the second pitch.

5. The display device of claim 1, wherein the third pitch is less than the second pitch.

6. The display device of claim 1, wherein the third pitch is equal to the second pitch.

7. The display device of claim 1, wherein, in a plan view, the first conductive lines and the second conductive lines are bent two or more times.

8. The display device of claim 7, wherein the first conductive lines and the second conductive lines are not bent in the bending area.

9. The display device of claim 1, wherein
    a portion of the first conductive lines and the second conductive lines disposed in the bending area is disposed on a different insulating film from a portion of the first conductive lines and the second conductive lines disposed in the first non-display area and the second non-display area, and a portion of the fan-out portion corresponding to the bending area is disposed on a different insulating film than a portion of the fan-out portion corresponding to the first non-display area and the second non-display area.

10. The display device of claim 9, wherein
the display part comprises:
a thin-film transistor; and
a light-emitting element electrically connected to the thin-film transistor,
the thin-film transistor comprises a semiconductor layer, a gate electrode, and a connection electrode electrically connected to the semiconductor layer,
the portion of the fan-out portion corresponding to the bending area and the connection electrode comprise a same material, and
the portion of the fan-out portion corresponding to the first non-display area and the second non-display area and the gate electrode comprise a same material.

11. The display device of claim 1, further comprising an insulating layer disposed on the substrate,
wherein the insulating layer comprises an opening corresponding to the bending area.

12. The display device of claim 11, further comprising an organic insulating layer disposed in the opening of the insulating layer.

13. The display device of claim 12, wherein a portion of the fan-out portion corresponding to the bending area is disposed on the organic insulating layer.

14. The display device of claim 1, wherein the first conductive lines and the second conductive lines include data lines.

15. A display device comprising:
a substrate including:
a display area,
a first non-display area adjacent to the display area;
a second non-display area; and
a bending area disposed between the first non-display area and the second non-display area; and
fan-out portion arranged over the first non-display area, the bending area, and the second non-display area, the fan-out portion comprising conductive lines disposed in the bending area with a separation area between the conductive lines, wherein
the conductive lines include:
first conductive lines that are apart from each other by a first pitch in the bending area;
second conductive lines that are apart from each other by a second pitch in the bending area; and
third conductive lines that are apart from each other by a third pitch in the bending area,
the third pitch is greater than the first pitch, and
the third pitch is less than or equal to the second pitch.

16. The display device of claim 15, wherein
the conductive lines disposed in an outer portion of the fan-out portion are apart from each other by the first pitch, and
the conductive lines disposed in a central portion of the fan-out portion are apart from each other by the second pitch.

17. The display device of claim 16, wherein the first pitch is less than the second pitch.

* * * * *